US008502958B2

United States Patent
Makita

(10) Patent No.: US 8,502,958 B2
(45) Date of Patent: Aug. 6, 2013

(54) POSITIONING DEVICE, LITHOGRAPHIC APPARATUS USING SAME, AND DEVICE MANUFACTURING METHOD

(75) Inventor: Yoshinori Makita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 473 days.

(21) Appl. No.: 12/791,432

(22) Filed: Jun. 1, 2010

(65) Prior Publication Data

US 2010/0309451 A1    Dec. 9, 2010

(30) Foreign Application Priority Data

Jun. 4, 2009 (JP) ................. 2009-135052
Apr. 28, 2010 (JP) ................. 2010-103548

(51) Int. Cl.
*G03B 27/58* (2006.01)
*G03B 27/42* (2006.01)
*H02K 41/02* (2006.01)
*G03F 7/20* (2006.01)

(52) U.S. Cl.
CPC .................. *G03F 7/70758* (2013.01)
USPC ............... 355/72; 355/53; 310/12.06

(58) Field of Classification Search
CPC ........... G03F 7/70758; G03F 7/70766
USPC ............ 355/52, 72, 75; 310/12.01, 12.05, 310/12.06
See application file for complete search history.

(56) References Cited

U.S. PATENT DOCUMENTS 6,037,680 A * 3/2000 Korenaga et al. ........... 310/12.22
2007/0194632 A1 * 8/2007 Yura et al. .................... 310/12

FOREIGN PATENT DOCUMENTS

| JP | 1-259405 A | 10/1989 |
| JP | 2001-085503 A | 3/2001 |
| JP | 2007-114550 A | 5/2007 |

* cited by examiner

*Primary Examiner* — Steven H Whitesell Gordon
(74) *Attorney, Agent, or Firm* — Canon U.S.A., Inc., IP Division

(57) ABSTRACT

The present invention provides a positioning device for positioning a table, including a base, a motor that drives the table in the driving area on the base, a position sensor that detects the position of the table, and a control unit that controls the motor. The control unit includes a first output unit that outputs electric current for controlling the position of the table based on the output of the position sensor; a second output unit that outputs electric current for imparting a thrust force, which is directed toward the center of the driving area, to the table; and a switch unit that switches from a state in which the motor is controlled depending on the output of the first output unit to a state in which the motor is controlled depending on the output of the second output unit, based on a stopping signal for stopping the table.

9 Claims, 7 Drawing Sheets

POSITIONING DEVICE, LITHOGRAPHIC APPARATUS USING SAME, AND DEVICE MANUFACTURING METHOD

BACKGROUND OF THE INVENTION

1. Field of the Invention

The present invention relates to a positioning device for positioning a table. The present invention also relates to a lithographic apparatus using the positioning device, and a device manufacturing method.

2. Description of the Related Art

FIG. 7 is a schematic diagram showing the configuration of a positioning device employed in a conventional lithographic apparatus. The following positioning device is based on the assumption that a linear motor is used as the driving unit for driving a table. A table 101 places various originals such as a reticle or various substrates such as a wafer for performing linear driving. The table 101 is mounted on a base 102, and the base 102 includes a guide (not shown) for guiding the table 101 in a predetermined axial direction. The distance over which the table 101 is moved on the guide is output by a position sensor 103 as a pulse signal. The pulse signal output from the position sensor 103 is integrated by a counter 104 so as to output the current position signal of the table 101.

A phase switch controller 105 outputs a coil selection signal to coil selection switches 106a to 106d, based on the current position signal from the counter 104. The coils 112a to 112d are connected to electric current amplifiers 108a to 108d, respectively, via the coil selection switches 106a to 106d, respectively. The phase of the coils 112a to 112d is switched by switching a electric current command value from a servo controller 107 depending on the coil selection signal. The servo controller 107 calculates the difference between the target position from an upper-level controller (not shown) and the table 101's current position from the counter 104 so as to perform control calculation such as position servo control or speed servo control. Furthermore, the servo controller 107 outputs a electric current command value calculated by the control calculation to the electric current amplifiers 108a to 108d. The electric current amplifiers 108a to 108d supply a drive electric current depending on the electric current command value from the servo controller 107 to the coils 112a to 112d, respectively. The coils 112a to 112d are fixed to a coil support member (not shown), and a linear motor is constituted by the coils 112a to 112d together with magnets (not shown) securely fixed to the table 101 in a predetermined arrangement. The linear motor causes a predetermined electric current to flow to the coils 112a to 112d in a predetermined order so as to drive the table 101 in the axial direction.

Braking switches 110a to 110d are respectively disposed between the coils 112a to 112d of the linear motor and the electric current amplifiers 108a to 108d. Here, the braking switches 110a to 110d typically connect the coils 112a to 112d to the current amplifiers 108a to 108d, respectively. When a braking signal, i.e., an emergency stopping signal from the upper level controller is input to a brake controller 109, the brake controller 109 switches all of the braking switches 110a to 110d to the opposite contact points. Then, both ends of all of the coils 112a to 112d are short-circuited so as to activate a dynamic brake. These effects are disclosed in Japanese Patent Laid-Open No. 2001-85503. Japanese Patent Laid-Open No. 1-259405 discloses a mechanical brake as the other braking function of the positioning device. Furthermore, Japanese Patent Laid-Open No. 2007-114550 discloses a positioning device using a dynamic brake provided with a linear motor in order to impart a thrust force to a table.

In order to stop the table 101 by means of a strong braking force, control driving such as position servo control, speed servo control, and the like is generally employed, and, it is assumed that all functions of the positioning device shown in FIG. 7 need to be operated in a normal way. For example, when the position sensor 103 does not operate normally due to a malfunction caused by a failure or noise, the control driving such as position servo or velocity servo described above cannot be used for braking. Accordingly, a brake function, which works even when any of the above functions of the positioning device are abnormal, becomes necessary. However, the braking force of the dynamic brake of the conventional positioning device is less than a fraction of that, as compared with a case where the table 101 is stopped using the control driving such as position control or velocity control. Hence, in recent positioning devices for which the acceleration and maximum speed have been increased to attain an increase in productivity, a conventional dynamic brake provides an insufficient braking force.

In addition, the dynamic brake has the characteristics that the braking force is weakened as the table speed decreases. Hence, when an emergency stop is carried out by the dynamic brake near the edges of the driving area on the base 102, the table 101 cannot be stopped within the driving area, resulting in a collision with the wall surface 113 of the base 102. In order to prepare for the collision, a shock absorber 114 has conventionally been provided on the wall surface 113 of the base 2. However, as described above, the acceleration and maximum speed of a table have been increasing year by year. Consequently, an impact upon collision with the shock absorber 114 has also been increased more than heretofore. Also, in order to accommodate an increase in the acceleration and the maximum speed of the table 101, the table itself is made a hollow structure for the purpose of weight reduction, so that a strong structure capable of undergoing a collision with the shock absorber 114 cannot be maintained. Thus, problems arise in that the table 101 itself may be destroyed due to an impact caused when the table 101 collides with the shock absorber 114.

Furthermore, the shock absorber 114 requires a large stroke, i.e., a large external dimension in order to absorb a violent impact as described above, which restricts the layout of the units of the exposure apparatus. Consequently, the size reduction of the exposure apparatus is prevented.

Moreover, as with the device disclosed in Japanese Patent Laid-Open No. 1-259405, a table provided with a brake mechanism increases the weight and the size thereof, whereby it becomes difficult to increase the acceleration and the maximum speed of the table. Consequently, an increase in productivity of the exposure apparatus may be prevented.

SUMMARY OF THE INVENTION

In view of the foregoing, the present invention provides a positioning device that provides a strong braking force upon the emergency stop of a weight-saving and miniaturized table without dependence on the control driving functions such as position control and speed control, an exposure apparatus using the same, and a device manufacturing method.

According to an aspect of the present invention, a positioning device for positioning a table is provided which includes a base; a motor that drives the table in the driving area on the base; a position sensor that measures the position of the table; and a control unit that controls the motor, wherein the control unit includes a first output unit that outputs a electric current for controlling the position of the table based on the output of the position sensor; a second output unit that outputs a current for imparting a thrust force, which is directed toward the center of the driving area, to the table; and a switch unit that switches from a state in which the motor is controlled depending on the output of the first output unit to a state in which the motor is controlled depending on the output of the second output unit, based on a stopping signal for stopping the table.

According to the present invention, a strong braking force is applied by imparting a thrust force directed toward the center of the driving area to the table. Hence, even when an emergency stop is required, the present invention provides an advantageous effect that an impact produced by the collision of the table with the shock absorber can be relieved. In addition, the table is not provided with the brake mechanism, whereby the table can be reduced in weight and size so as to improve its acceleration and speed. Hence, the present invention provides an advantageous effect that contributes to an increase in productivity of the exposure apparatus.

Further features of the present invention will become apparent from the following description of exemplary embodiments with reference to the attached drawings.

DESCRIPTION OF THE EMBODIMENTS

Figure 1:
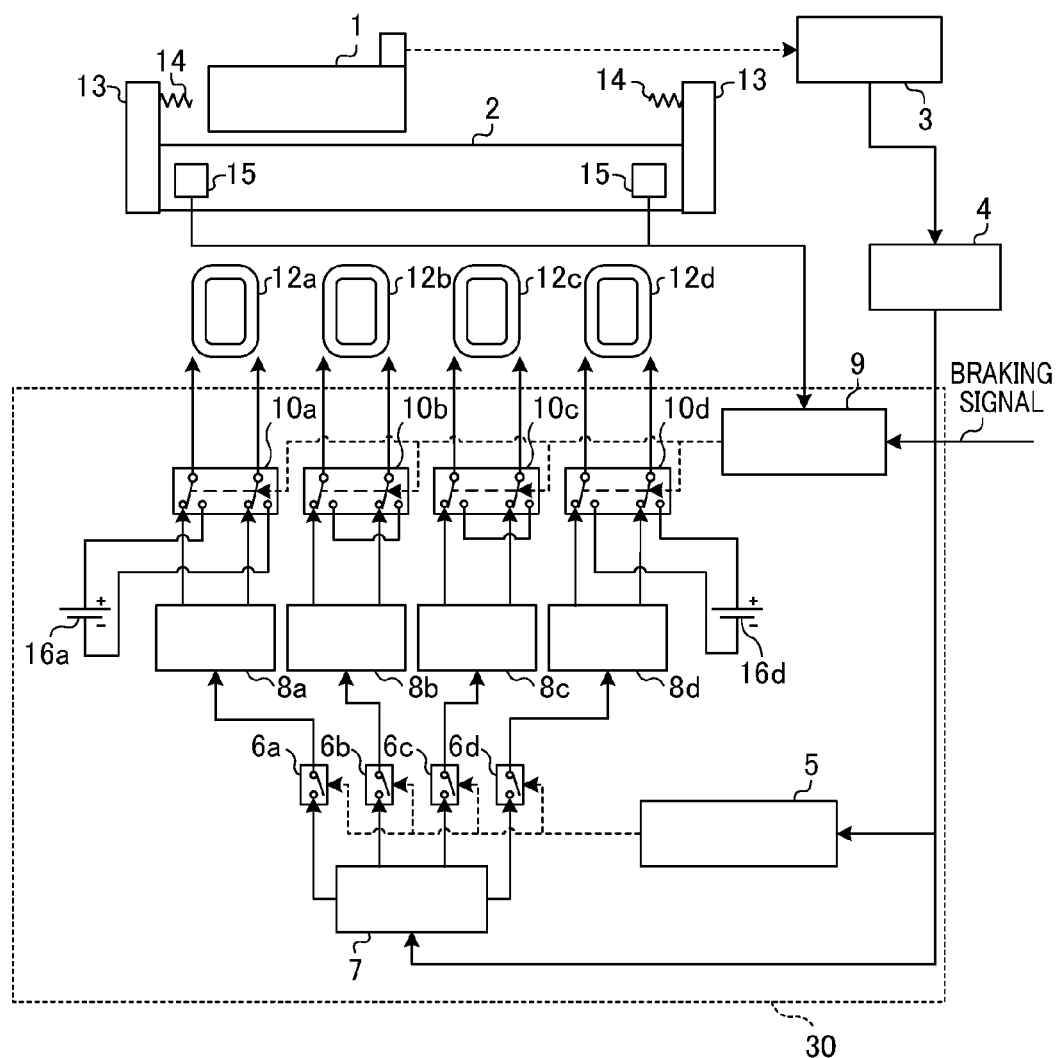
FIG. 1 is a schematic view illustrating the configuration of a positioning device according to a first embodiment of the present invention.

Hereinafter, preferred embodiments of the present invention will now be described with reference to the accompanying drawings.
(First Embodiment)
FIG. 1 is a schematic view illustrating the configuration of a positioning device according to a first embodiment of the present invention. The present embodiment illustrates the use of a linear motor serving as the motor for driving a table. The table 1 places various originals such as a reticle or various substrates such as a wafer for performing linear driving. The table 1 is mounted on a base 2, and the base 2 includes a guide (not shown) for guiding the table 1 in a predetermined axial direction. The distance over which the table 1 is moved on the guide is output by a position sensor 3 as a pulse signal. For the position sensor 3, a laser interferometer, a linear encoder, or the like may be used. The pulse signal output from the position sensor 3 is integrated by a counter 4 so as to output the table 1's current position signal.

A control unit 30 that controls a linear motor includes controllers 5, 7, and 9, electric current amplifiers 8a to 8d, electric current sources 16a and 16d, and switches 6a to 6d and 10a to 10d. Based on the table 1's current position signal output from the counter 4, a phase switch controller 5 outputs a coil selection signal to coil selection switches 6a to 6d. A plurality of coils 12a to 12d constituting a linear motor is respectively connected to the electric current amplifiers 8a to 8d, i.e., motor drivers via coil selection switches 6a to 6d, respectively. The phase of the coils 12a to 12d is switched by switching a electric current command value from a servo controller 7 depending on the coil selection signal. The servo controller 7 calculates the difference between the target position from an upper-level controller (not shown) and the table 1's current position from the counter 4 so as to perform control calculation such as position servo control or speed servo control. A electric current command value is then output to the electric current amplifiers 8a to 8d. The electric current amplifiers 8a to 8d outputs a electric current amplified depending on the electric current command value from the servo controller 7 to the coils 12a to 12d, respectively. The coils 12a to 12d are fixed to a coil support member (not shown), and a linear motor is constituted by the coils 12a to 12d together with magnets (not shown) securely fixed to the table 1 in a predetermined arrangement. The linear motor causes a predetermined electric current to flow to the coils 12a to 12d in a predetermined order so as to drive the table 1 in the axial direction. A range in which the table 1 is driven on the base 2 is set as a driving area (not shown).

Next, a braking action of a positioning device according to the present embodiment will now be described. The coils 12a to 12d are constituted by the first coils (12a and 12d in FIG. 1) positioned at both ends of the arrangement and the second coils (12b and 12c in FIG. 1) disposed between the first coils. Braking switches 10a to 10d are respectively disposed between the coils 12a to 12d and the electric current amplifiers 8a to 8d. The braking switches 10a to 10d respectively connect the coils 12a to 12d to the electric current amplifiers 8a to 8d during normal driving to thereby constitute a drive circuit. On the other hand, during braking, the first coils (12a and 12d) are switched to a braking circuit including electric current sources 16a and 16d to be described below using the switches 10a and 10d for the connection. Also, the second coils (12b and 12c) are switched to a short circuit short-circuiting both ends of the coils using the switches 10b and 10c for the connection. In this way, both of the first coils and the second coils are respectively interchangeably connected to the drive circuit (first output step) and the braking circuit or the short circuit (second output step) via the braking switches 10a to 10d.

Here, if an upper-level controller (not shown) detects some trouble in a positioning device or a lithographic apparatus, a braking signal, which is an emergency stopping signal (stop signal) of the table, is input to a brake controller 9. Switching from the drive circuit to the braking circuit is carried out when the table 1 is positioned at an emergency braking area (braking area: not shown) located at the peripheral edge part of the driving area. In other words, the switches 10a and 10d switch from a state in which the motor is controlled depending on the output of the servo controller 7 and the electric current amplifiers 8a to 8d to a state in which the motor is controlled (braked) depending on the output of the electric current sources 16a and 16d, based on the emergency stopping signal. In this case, the switches 10a and 10d are collectively referred to as a "switch unit", the servo controller 7 and the electric current amplifiers 8a and 8d are collectively referred to as a "first output unit" that implements a first output step, and the electric current sources 16a and 16d are collectively referred to as a "second output unit" that implements a second output step.

The table 1 that has reached the emergency braking area has kinetic energy directed outwardly of the driving area passing through the emergency braking area, i.e., kinetic energy directed toward the wall surface 13 of the base 2. The first coils are disposed at a position substantially corresponding to the emergency braking area. When the first coils are switched and connected to the braking circuit, a predetermined electric current is output from the electric current sources 16a and 16d. The predetermined electric current imparts a thrust force acting in a direction opposite to kinetic energy directed toward the wall surface 13, i.e., a thrust force directed toward the center of the driving area to the table 1. Hence, the thrust force acts as a strong braking force against kinetic energy, which is exerted on the table 1, directed toward the wall surface 13 with high speed. Furthermore, unlike a conventional dynamic brake, there is provided an advantageous effect that the braking force does not decrease even with decreasing table speed.

On the other hand, the second coils are disposed at a position substantially corresponding to a driving area inside the emergency braking area, and act as a braking force when the table 1, which has been moved from the emergency braking area toward the center, is moved to the driving area inside the emergency braking area. In this case, the second coils are switched to a short circuit short-circuiting both ends thereof to thereby activate as a dynamic brake. In this way, when the table 1 is moved within the driving area inside the emergency braking area after the braking control is carried out in the emergency braking area, the table 1 is braked by the action of the dynamic brake, whereby the table 1 can be quickly and appropriately stopped. Hereinafter, the effect is the same as that of the second to fifth embodiments. It should be noted that the second coils also work even in the case in which the table 1, which moves within the driving area inside the emergency braking area, is braked.

When the speed of the table 1, which has reached the emergency braking area, is low, the first coils connected to the braking circuit serve as an acceleration force directed toward the center of the driving area after the table 1 has been stopped. Hence, although the table 1 moves with a large acceleration in the center of the driving area, the table 1 is stopped by the action of the dynamic brake effected by the second coils when the table 1 is moved inside the emergency braking area. Consequently, the acceleration force directed toward the center of the driving area is relieved. While in the present embodiment the coils located at both ends of the driving area among a' plurality of the arranged coils are connected with the braking circuit, a plurality of coils including both ends thereof may be connected with the braking circuit.

In the present embodiment, the electric current sources 16a and 16d are independent from the electric current amplifiers 8a to 8d and are dedicated to braking. Hence, this configuration has an advantage in that the braking control can be carried out in a stable way even when the driving function, such as the electric current amplifiers 8a to 8d and the like, is defective. Examples of the electric current sources 16a and 16d available in this case include a electric current amplifier of the same type as the aforementioned electric current amplifiers 8a to 8d, a DC power supply, a charged capacitor, a charged battery, or the like. The electric current output from the electric current sources 16a and 16d may be a preset constant value, may increase/decrease depending on the time function, or may increase/decrease synchronously with an external signal such as a limit detection signal to be described below.

In the present embodiment, a limit detection sensor (detector) 15 is provided which detects the position of the table 1 at the emergency braking area and outputs the detection signal. Examples of the limit detection sensor 15 available in this case include a photo-interrupter, a micro switch, and the like. An area sensor may also be employed for a two-dimensionally driven wafer stage. When the detection signal from the limit detection sensor 15 is input to the brake controller 9, a predetermined electric current is output from the electric current sources 16a and 16d. The predetermined electric current generates a strong braking force, which imparts a thrust force directed toward the center of the driving area to the table 1. When the detection signal is not input to the brake controller 9, the output voltage of the electric current sources 16a and 16d is reduced to 0 V to thereby activate a dynamic brake. In other words, the switches 10a and 10d switch from a state in which the motor is controlled depending on the output of the servo controller 7 and the electric current amplifiers 8a and 8d to a state in which the motor is controlled depending on the output of the electric current sources 16a and 16d, based on an emergency stopping signal.

Also, a shock absorber 14 is provided on the wall surface 13 of the base 2 in order to prevent the table 1 from being damaged due to a collision of the table 1 against the wall surface 13. Any impact is relieved in the event that the table 1 cannot be stopped by the braking action performed in the present embodiment, and thereby collides against the wall surface 13. However, the positioning device according to the present embodiment sufficiently slows down the table 1, whereby an impact of the table 1 colliding against the wall surface 13 can be weakened. Accordingly, it is not necessary to strengthen the table 1 so as to withstand an impact with the shock absorber 14, whereby the table 1 can be reduced in weight. The shock absorber 14 may also be reduced in size because no large impact absorption is required thereby, which also provides the advantageous effect that the degree of freedom in design of an exposure apparatus including a positioning device is enhanced.

(Second Embodiment)

Next, a positioning device according to a second embodiment of the present invention will now be described with reference to FIG. 2. For the positioning device of the present embodiment, the electric current amplifiers 8a and 8d for performing the driving of a linear motor are employed as electric current sources during braking. The same elements as those shown in FIG. 1 and having the same function are designated by the same reference numerals and the explanation thereof will be omitted. Hereinafter, the parts shown in FIG. 2, which are different from those shown in FIG. 1, will be described in detail.

A control unit 31 that controls a linear motor includes controllers 5, 7, and 9, electric current amplifiers 8a to 8d, electric current command value setters 22a and 22d, and switches 6a to 6d, 10a to 10d, 21a and 22d. While in FIG. 1 the electric current sources 16a and 16d dedicated for braking are respectively connected to the coils 12a and 12d as the electric current sources for generating a thrust force, which is imparted to the table 1, directed toward the center of the driving area, the electric current amplifiers 8a and 8d for control driving are also employed for braking in FIG. 2. As in the first embodiment, the servo controller 7 is connected to the electric current amplifier 8a via the coil selection switch 6a. In addition, the electric current command value setter 22a is connected to the electric current amplifier 8a via a electric current command value connecting switch 21a for generating the thrust force. Furthermore, the electric current command value setter 22d is connected to the electric current amplifier 8d via a electric current command value connecting switch 21d for generating the thrust force. In other words, the electric current command value setters 22a and 22d output a command value for a electric current that causes the table 1 to be directed toward the center of the driving area to the electric current amplifiers 8a and 8d, respectively. When a braking signal from an upper-level controller (not shown) is input to the brake controller 9, the brake controller 9 switches all of the braking switches 10a to 10d to the opposite contact points. Then, both ends of all of the coils 12a to 12d are short-circuited so as to activate a dynamic brake.

When the table 1 has reached the emergency braking area and the detection signal from the limit detection sensor 15 has been input to the brake controller 9, the brake controller 9 switches the braking switch 10a to the electric current amplifier 8a side and at the same time the electric current amplifier 8a is connected with the electric current command value connecting switch 21a. Then, the thrust force for causing the table 1 to be directed toward the center of the driving area is generated on the coil 12a. Likewise, the brake controller 9 switches a braking switch 10d to the electric current amplifier 8d side and at the same time the electric current amplifier 8d is connected with the electric current command value connecting switch 21d. Consequently, the thrust force for causing the table 1 to be directed toward the center of the driving area is generated on the coil 12d. In other words, the switches 21a and 21d switch from a state in which the motor is controlled depending on the output of the servo controller 7 and the electric current amplifiers 8a and 8d to a state in which the motor is controlled depending on the output of the electric current command value setters 22a and 22d and the electric current amplifiers 8a and 8d, based on an emergency stopping signal. In this case, the switches 21a and 21d are collectively referred to as a "switch unit", the servo controller 7 and the electric current amplifiers 8a and 8d are collectively referred to as a "first output unit", and the electric current command value setters 22a and 22d and the electric current amplifiers 8a and 8d are collectively referred to as a "second output unit". When the table 1 is driven in the center of the driving area to thereby fall outside the limit of detection (i.e., when table 1 falls outside the emergency braking area), both ends of all of the coils 12a to 12d are again short-circuited so as to activate a dynamic brake.

(Third Embodiment)

Next, a positioning device according to a third embodiment of the present invention will now be described with reference to FIG. 3. The function of the electric current command value connecting switches 21a and 21d as well as the electric current command value setters 22a and 22d described in FIG. 2 can be also realized by using the control software of the servo controller 7 as shown in FIG. 3. The positioning device of the present embodiment is configured such that a braking signal from an upper-level controller (not shown) and a detection signal from the limit detection sensor 15 are input to the servo controller 7. During normal operation, the servo controller 7 calculates the difference between the target position from an upper-level controller (not shown) and the table 1's current position from the counter 4 so as to perform control calculation such as position control or speed control, and the electric current command value calculated thereby is then output to the electric current amplifiers 8a to 8d. When the braking signal and the detection signal have both been input to the servo controller 7, the servo controller 7 outputs a command value for a electric current for generating a thrust force directed toward the center of the driving area to the electric current amplifiers 8a and 8d via the coil selection switches 6a and 6d.

Figure 2:
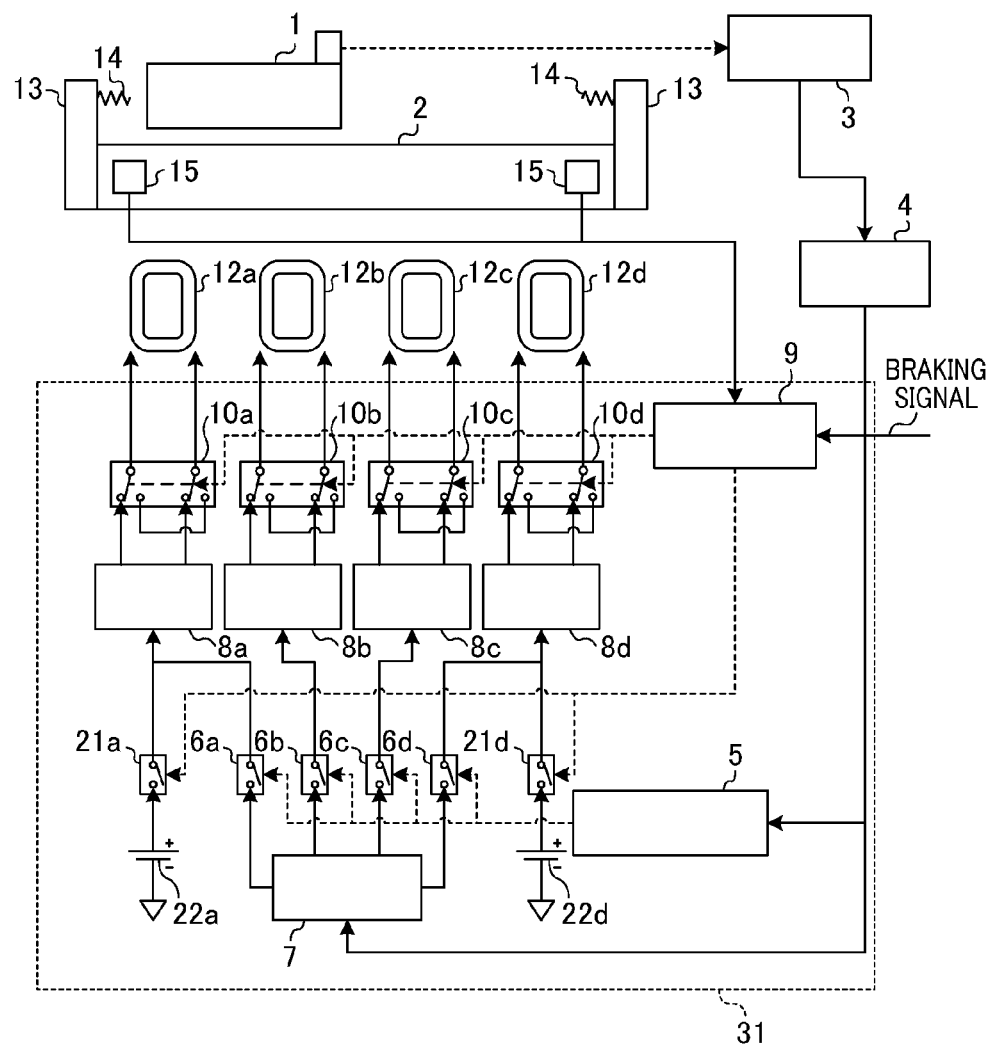
FIG. 2 is a schematic view illustrating the configuration of a positioning device according to a second embodiment of the present invention.
Figure 3:
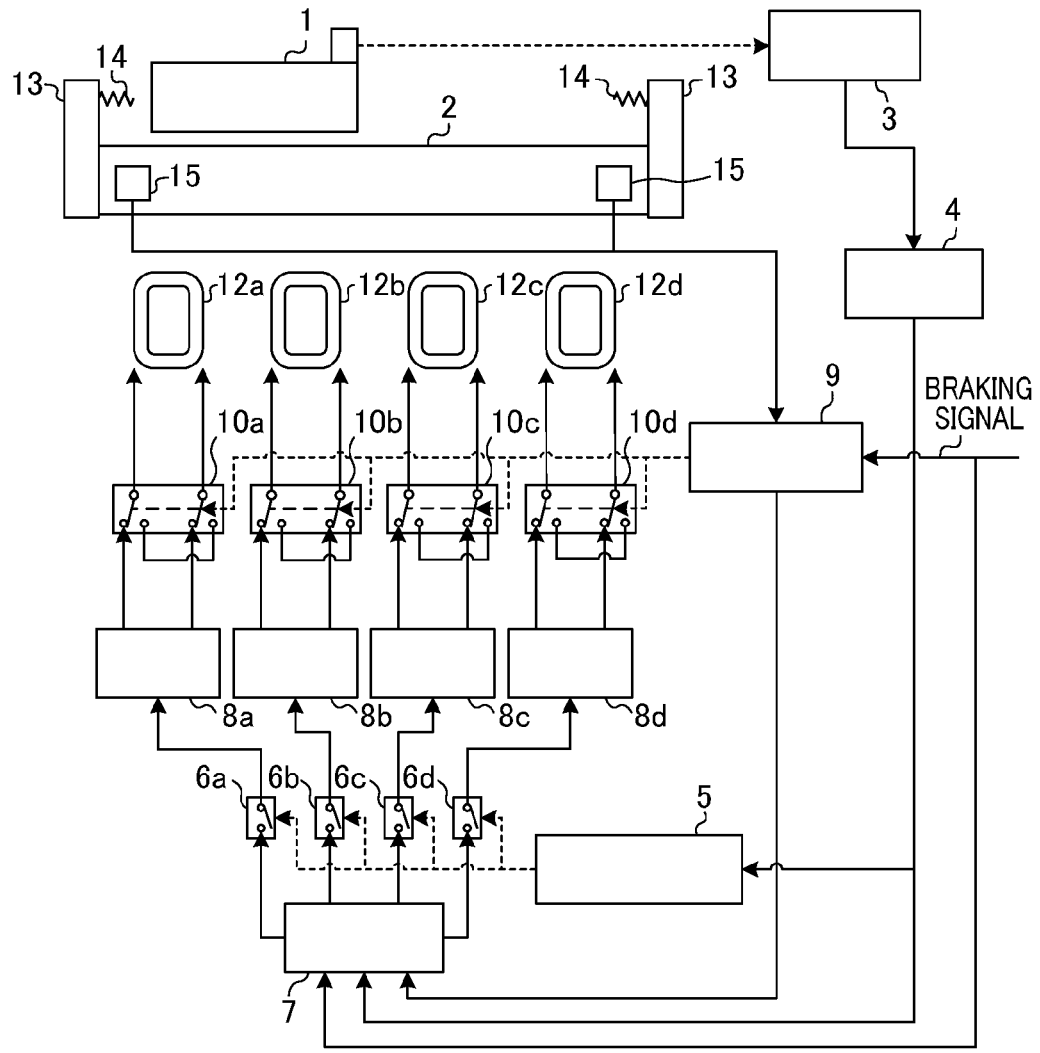
FIG. 3 is a schematic view illustrating the configuration of a positioning device according to a third embodiment of the present invention.
Figure 3:
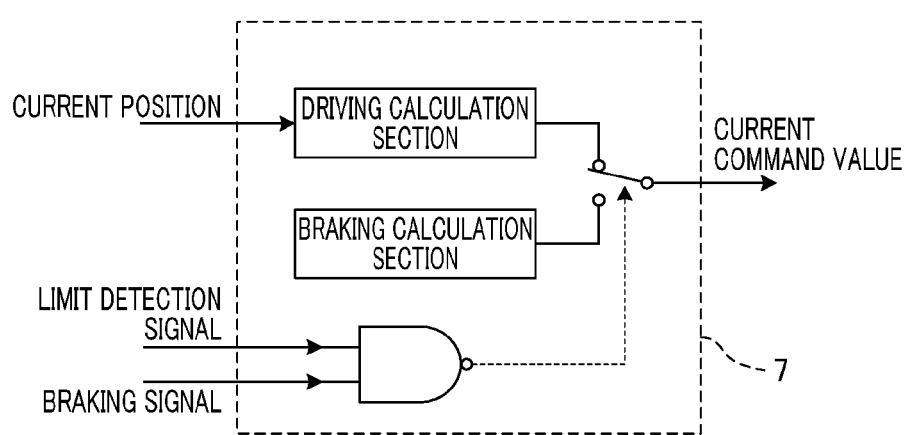
Figure 7:
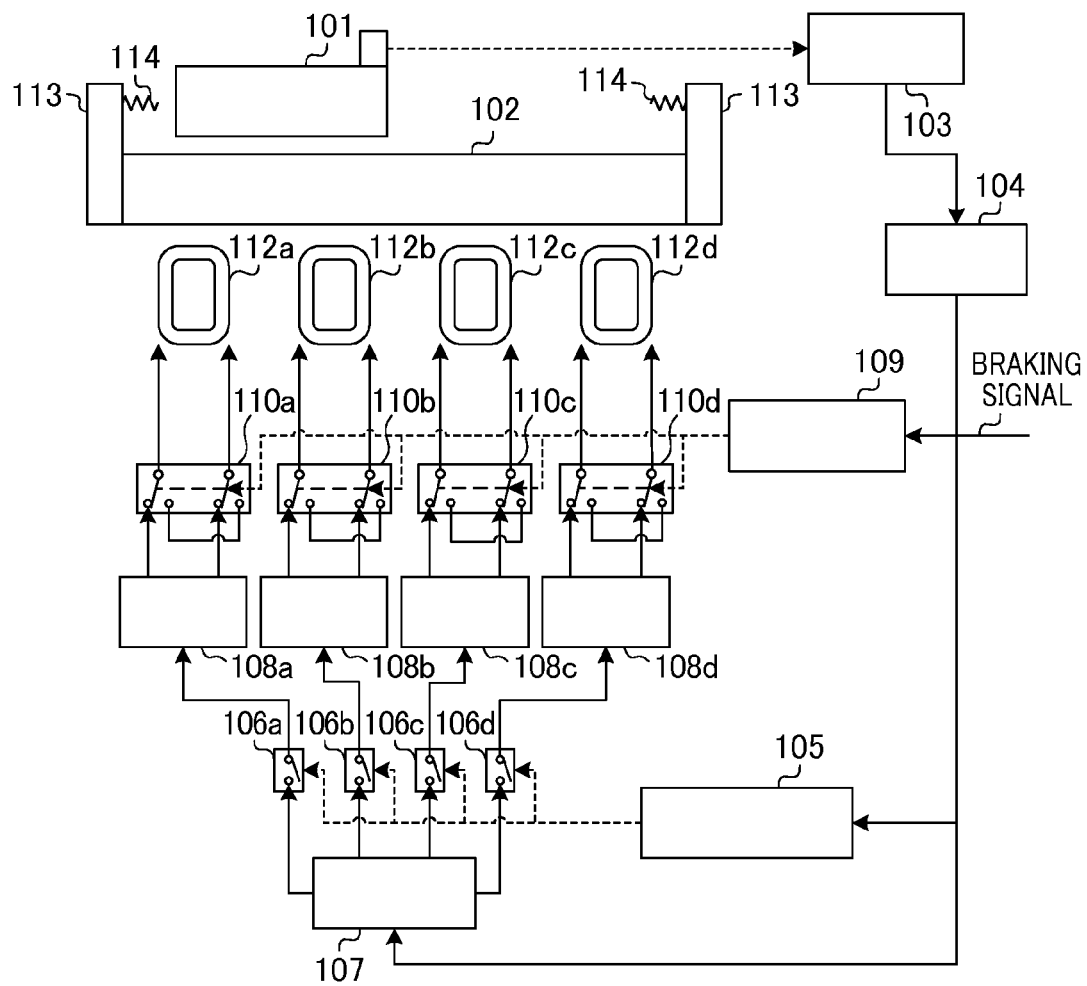
FIG. 7 is a schematic view illustrating the configuration of a conventional positioning device.

With this arrangement, the configuration of the electric current sources 16a and 16d shown in FIG. 1 and the electric current command value connecting switches 21a and 21d and the electric current command value setters 22a and 22d shown in FIG. 2 becomes unnecessary. Accordingly, the stage control device of the present invention can be implemented with a small change in the hardware configuration of the conventional positioning device (FIG. 7).

(Fourth Embodiment)

Figure 4:
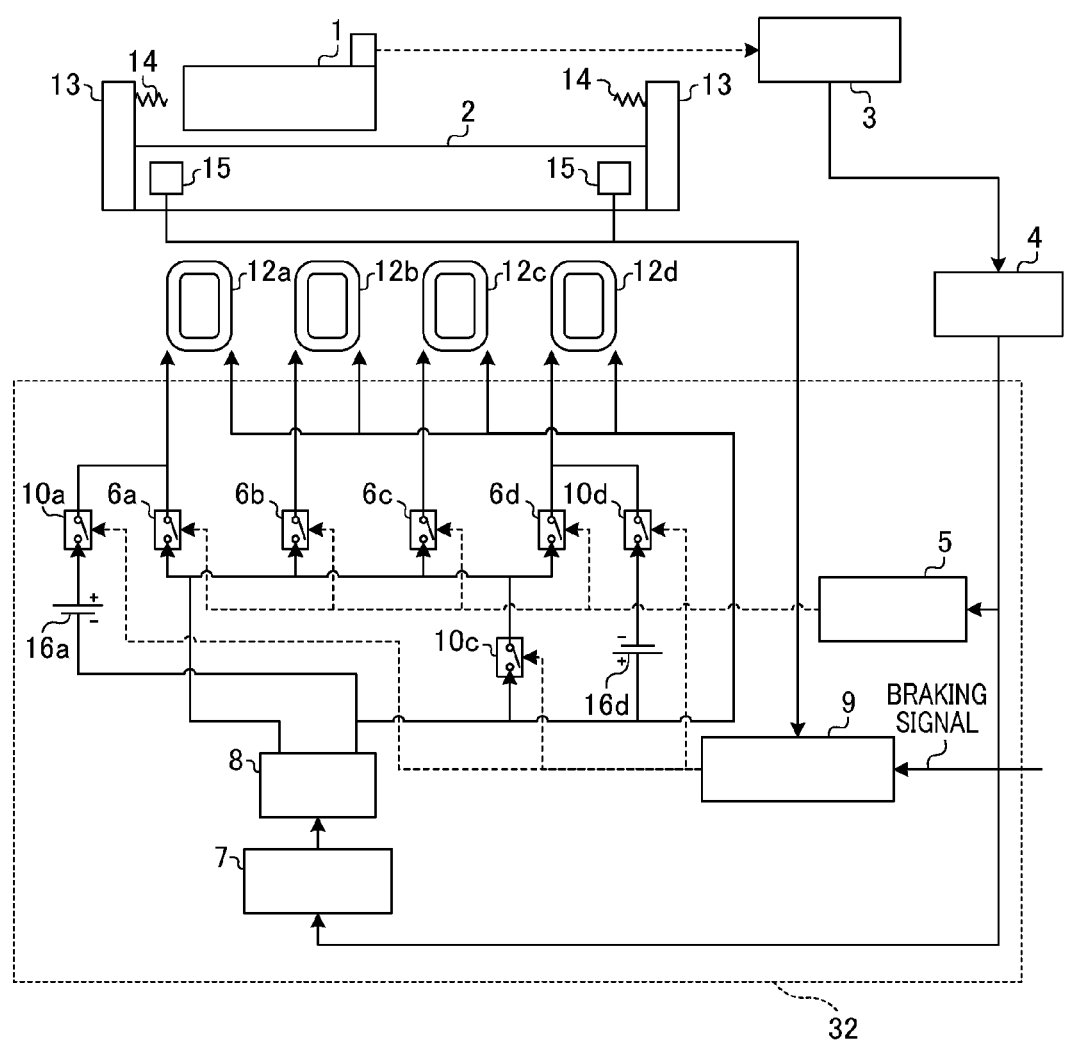
FIG. 4 is a schematic view illustrating the configuration of a positioning device according to a fourth embodiment of the present invention.

Next, a positioning device according to a fourth embodiment of the present invention will now be described with reference to FIG. 4. As shown in FIG. 3, a plurality of coils 12a to 12d of a single-phase motor is connected to a single electric current amplifier 8. The positioning device of the present embodiment is driven by interchangeably using the coils 12a to 12d. The same elements as those shown in FIGS. 1 and 2 and having the same function are designated by the same reference numerals and the explanation thereof will be omitted. Hereinafter, the parts shown in FIG. 4, which are different from those shown in FIG. 1 or 2, will be described in detail.

A control unit 32 that controls a linear motor includes controllers 5, 7, and 9, a electric current amplifier 8, electric current sources 16a and 16d, and switches 6a to 6d and 10a to 10d. Based on a current position of the table 1 from the counter 4, the phase switch controller 5 outputs a coil selection signal to the coil selection switches 6a to 6d. The coils 12a to 12d of a linear motor are respectively connected to the electric current amplifier 8 via the coil selection switches 6a to 6d. The phase is switched by interchangeably supplying a drive electric current from the electric current amplifier 8 to the coils 12a to 12d via the coil selection switches 6a to 6d depending on the coil selection signal from the phase switch controller 5. The servo controller 7 calculates the difference between the target position through an upper-level controller (not shown) and the table 1's current position from the counter 4 so as to perform control calculation such as position control or speed control, and the electric current command value calculated thereby is then output to the electric current amplifier 8. On the wire connecting the electric current amplifier 8 and the coil selection switches 6a to 6d, the braking switch 10c for the coils 12a to 12d is connected via a common wire. Furthermore, the coil 12a is connected to the coil selection switch 6a as well as the electric current source 16a via the braking switch 10a. Likewise, the coil 12d is connected to the coil selection switch 6d as well as the electric current source 16d via the braking switch 10d. The electric current to be output from the electric current sources 16a and 16d generates the thrust force for causing the table 1 to be directed toward the center of the driving area. In other words, when the braking signal is input to the brake controller 9, the coils 12a and 12d are respectively connected to the electric current sources 16a and 16d via the braking switches 10a and 10d, respectively, to thereby generate the thrust force for causing the table 1 to be directed toward the center of the driving area. At the same time, both ends of the coils 12b and 12c are short-circuited between the coil selection switches 6b and 6c and the braking switch 10c, which operates as a dynamic brake. When the table 1 is moved to the center of the driving area and the detection signal is not output from the limit detection sensor 15, both ends of the coils 12a and 12d are short-circuited through the coil selection switch 6a and the braking switch 10c and through the coil selection switch 6d and the braking switch 10c, respectively. Then, the short-circuited circuit operates as a dynamic brake. While FIG. 4 shows a circuit diagram in the case of a single-phase motor, it is apparent that a two-phase motor or a multiphase motor can be arranged in the same manner as in the single-phase motor although a plurality of the electric current amplifiers is employed. As described above, the switches 10a and 10d switch from a state in which the motor is controlled depending on the output of the servo controller 7 and the electric current amplifier 8 to a state in which the motor is controlled depending on the output of the electric current sources 16a and 16d, based on an emergency stopping signal. In this case, the switches 10a and 10d are collectively referred to as a "switch unit", the servo controller 7 and the electric current amplifier 8 are collectively referred to as a "first output unit", and the electric current sources 16a and 16d are collectively referred to as a "second output unit".

(Fifth Embodiment)

Figure 5:
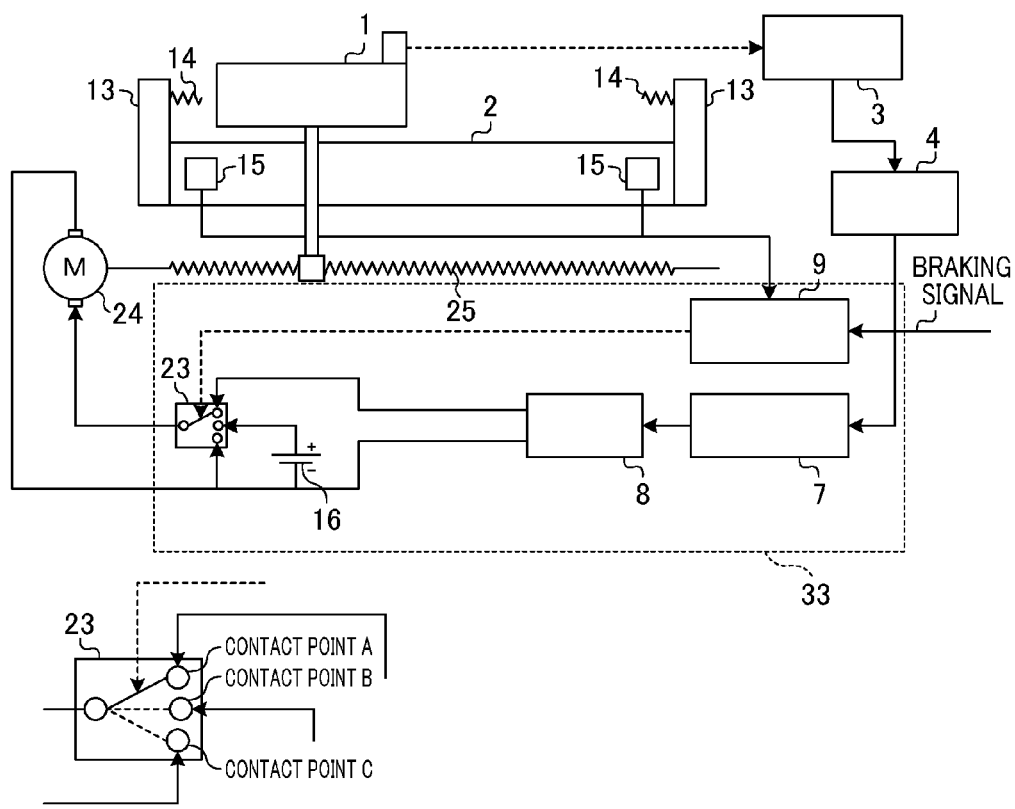
FIG. 5 is a schematic view illustrating the configuration of a positioning device according to a fifth embodiment of the present invention.

Next, a positioning device according to a fifth embodiment of the present invention will now be described with reference to FIG. 5. In the present embodiment, a rotary motor 24 and a ball screw 25 are employed as a driving source instead of the linear motor employed in the first to fourth embodiments. The same elements as those shown in FIGS. 1 to 4 and having the same function are designated by the same reference numerals and the explanation thereof will be omitted. Hereinafter, the parts shown in FIG. 5, which are different from those shown in FIGS. 1 to 4, will be described in detail.

The rotary motor 24 is a known rotation-type DC servo motor. The ball screw 25 converts the rotational drive of the rotary motor 24 into a linear drive so as to drive the table 1 in a drive axis direction. Both ends of the rotary motor 24 are connected to a diverter switch 23. During normal driving operation, the diverter switch 23 is connected to a contact point A. When the diverter switch 23 is connected to the contact point A, the diverter switch 23 is connected to the electric current amplifier 8 which is connected to the servo controller 7, whereby control driving such as position control or speed control is performed. When a braking signal from the upper level has been input to the brake controller 9 and the detection signal from the limit detection sensor 15 has been input thereto, the diverter switch 23 is connected to a contact point B. When the diverter switch 23 is connected to the contact point B, a predetermined electric current is supplied from the electric current source 16 to the rotary motor 24. The rotary motor 24, to which the predetermined electric current has been supplied, generates a thrust force in a direction opposite to an acceleration force directed toward the wall surface 13 of the base 2, i.e., a thrust force directed toward the center of the driving area. When the braking signal from the upper level has been input to the brake controller 9 and the detection signal from the limit detection sensor 15 has not been input thereto, the diverter switch 23 is connected to a contact point C. When the diverter switch 23 is connected to the contact point C, both ends of the coil of the rotary motor 24 are short-circuited to thereby operate as a dynamic brake. In other words, the switch 23 switches from a state in which the motor is controlled depending on the output of the servo controller 7 and the electric current amplifier 8 (first output unit) to a state in which the motor is controlled depending on the output of the electric current source 16 (second output unit), based on an emergency stopping signal. In this case, the switch 23 is referred to as a "switch unit", the servo controller 7 and the electric current amplifier 8 are collectively referred to as a "first output unit", and the electric current source 16 is referred to as a "second output unit".

(Sixth Embodiment)

Figure 6:
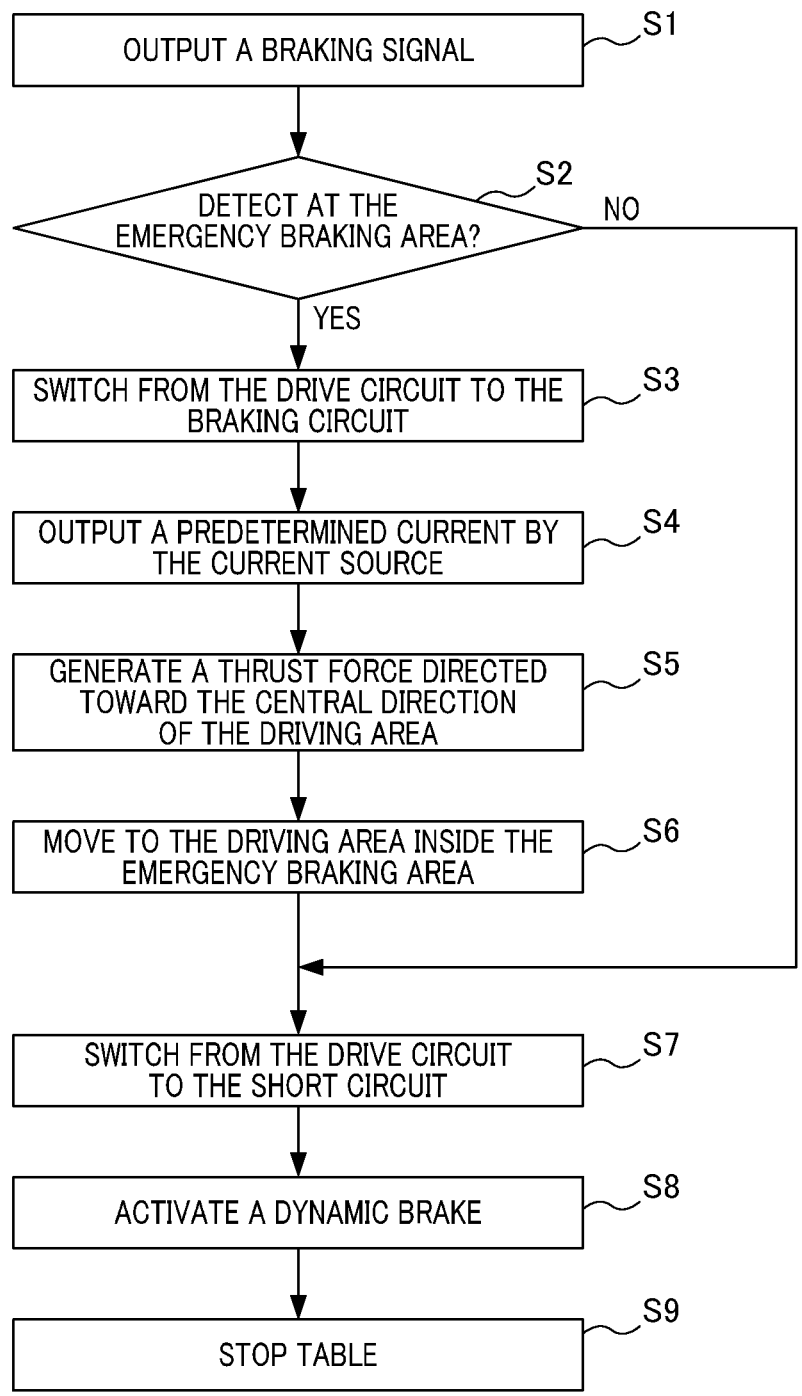
FIG. 6 shows a flowchart illustrating a positioning method according to an embodiment of the present invention.

Next, a method for controlling a positioning device according to an embodiment of the present invention will now be described. FIG. 6 shows a flowchart illustrating a method for controlling a positioning device according to an embodiment of the present invention. A description will be appropriately given with reference to the reference numerals shown in FIGS. 1 to 5.

First, if an upper-level controller (not shown) detects some trouble in a positioning device or a lithographic apparatus, an emergency stopping signal (braking signal) is output to a brake controller 9 (step S1). Next, it is detected that the table 1 for placing various originals or various substrates and moving over the driving area on the base 2 is positioned at the emergency braking area (step S2). This detection may be carried out by the limit detection sensor 15 described in FIG. 1. As used herein, the term "emergency braking area" means the area for the determination of switching to the braking circuit during an emergency. However, there is no problem in that the table is positioned at the area during normal operation. When a detection signal has been output due to a detection, a circuit connected to a motor is switched from the drive circuit to the braking circuit in order to execute an emergency braking control (step S3).

The braking circuit is connected to the electric current source 16a (16d) to thereby output a predetermined electric current (step S4). The predetermined electric current imparts a thrust force acting in a direction opposite to the kinetic energy directed toward the wall surface 13, i.e., a thrust force directed toward the center of the driving area to the table 1 (step S5).

When the table 1 is moved toward the center of the driving area by the thrust force to thereby fall outside detection and is moved to the driving area inside the emergency braking area (step S6), the connection of the motor is switched to the short circuit short-circuiting both ends thereof (step S7). Switching to the short circuit is similarly carried out in the case where it has not been detected in step S2 that the table 1 is positioned at the emergency braking area.

When the connection of the coil of the motor is switched to the short circuit, the motor operates as a dynamic brake (step S8) to thereby stop the table 1 (step S9). In this way, when the table 1 is moved within the driving area after the braking control is carried out in the emergency braking area, the table 1 brakes due to the action of the dynamic brake, whereby the table 1 can be quickly and appropriately stopped.

(Lithographic Apparatus)

Hereinafter, a description will now be given of a lithographic apparatus to which the positioning device of the present invention is applied. A lithographic apparatus is an apparatus that transfers a pattern onto a substrate, including an exposure apparatus, an electron beam drawing apparatus, an imprinting apparatus, and other pattern transferring apparatus. An electron beam drawing apparatus includes a maskless type that does not have a pattern-formed original. The positioning device according to the aforementioned embodiments is employed for the positioning of a table that is movable with a pattern-formed original or substrate mounted.

(Device Manufacturing Method)

Next, a method of manufacturing a device (semiconductor device, liquid crystal display device, etc.) as an embodiment of the present invention is described. The semiconductor device is manufactured through a front-end process in which an integrated circuit is formed on a wafer, and a back-end process in which an integrated circuit chip is completed as a product from the integrated circuit on the wafer formed in the front-end process. The front-end process includes a step of exposing a wafer coated with a photoresist to light using the above-described exposure apparatus of the present invention, and a step of developing the exposed wafer. The back-end process includes an assembly step (dicing and bonding), and a packaging step (sealing). The liquid crystal display device is manufactured through a process in which a transparent electrode is formed. The process of forming a plurality of transparent electrodes includes a step of coating a glass substrate with a transparent conductive film deposited thereon with a photoresist, a step of exposing the glass substrate coated with the photoresist thereon to light using the above-described exposure apparatus, and a step of developing the exposed glass substrate. The device manufacturing method of this embodiment has an advantage, as compared with a conventional device manufacturing method, in at least one of performance, quality, productivity and production cost of a device.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications Nos. 2009-135052 filed Jun. 4, 2009, and 2010-103548 filed Apr. 28, 2010 which are hereby incorporated by reference herein their entirety.

What is claimed is:

1. A positioning device for positioning a table, comprising:
a base;
a motor that drives the table in a driving area on the base;
a position sensor that detects the position of the table; and
a control unit that controls the motor,
wherein the control unit comprises:
a first output unit that outputs electric current controlling the position of the table based on the output of the position sensor;
a second output unit that outputs electric current imparting a thrust force, which is directed toward the center of the driving area and does not decrease even with decreasing table speed, to the table; and
a switch unit that switches from a state in which the motor is controlled depending on the output of the first output unit to a state in which the motor is controlled depending on the output of the second output unit, based on a stopping signal for stopping the table.

2. The positioning device according to claim 1, wherein the switch unit switches its state when the table is positioned at a braking area which is located at the peripheral edge part of the driving area.

3. The positioning device according to claim 2, wherein the switch unit switches from a state in which the motor is controlled depending on the output of the first output unit to a state in which both ends of a coil of the motor are short-circuited, if the table is positioned at a driving area inside the braking area.

4. The positioning device according to claim 2, further comprising:
a limit detection sensor for detecting that the table is positioned at the braking area,
wherein the switch unit switches its state based on the output and the emergency stopping signal of the sensor.

5. The positioning device according to claim 1,
wherein, the motor is a linear motor having first coils positioned at both ends of the array and a second coil positioned between the first coils,
wherein the switch unit switches from a state in which an electric current is caused to flow into the first coils depending on the output of the first output unit to a state in which an electric current is cause to flow into the first coils depending on the output of the second output unit, when the table is positioned at an area corresponding to the first coils and receives the stopping signal, and
wherein the switch unit switches from a state in which an electric current is caused to flow into the second coil depending on the output of the first output unit to a state in which both ends of the second coil are short-circuited, when the table is positioned at an area corresponding to the second coil and receives the stopping signal.

6. A positioning device for causing a table to be driven in a driving area of a base on which the table is mounted, the positioning device comprising:
a motor connected to a drive circuit that drives the table;
an electric current source that outputs a predetermined electric current imparting a thrust force, which is directed toward the center of the driving area and does not decrease even with decreasing table speed, to the table; and
a braking control unit configured to switch connection of the motor from the drive circuit to a braking circuit including the electric current source based on a stopping signal, when the table is positioned at a braking area located at the peripheral edge part of the driving area.

7. A control method for controlling a motor that drives a table in a driving area on a base, the control method comprising:
a step of measuring the position of the table;
a first output step of outputting an electric current controlling the position of the table based on the measured position;
a second output step of outputting electric current imparting a thrust force, which is directed toward the center of the driving area and does not decrease even with decreasing table speed, to the table;
a step of receiving a stopping signal for stopping the table; and
a step of switching from a state in which the motor is controlled depending on the output of the first output step to a state in which the motor is controlled depending on the output of the second output step, based on the received stopping signal.

8. A control method in which a driving source connected to a drive circuit causes a table mounted on a base to be driven in a driving area of the base, the control method comprising the steps of:
receiving a stopping signal for stopping the table;
detecting that the table is reached to a braking area positioned at the peripheral edge part of the driving area;
switching the driving source from the drive circuit to a braking circuit including an electric current source which imparts a thrust force, which is directed toward the center of the driving area and does not decrease even with decreasing table speed, to the table on the basis of the reception of the stopping signal and the detection; and
switching the driving source to a short circuit short-circuiting both ends of the driving source so as to activate a dynamic brake, when the table is reaches a driving area inside the braking area with the aid of the thrust force imparted from the electric current source.

9. A lithographic apparatus that transfers a pattern onto a substrate, comprising:
a table that is movable with a pattern-formed original or the substrate mounted,
a base;
a motor that drives the table in a driving area on the base;
a position sensor that detects the position of the table; and a control unit that controls the motor, wherein the control unit comprises:
- a first output unit that outputs electric current controlling the position of the table based on the output of the position sensor;
- a second output unit that outputs electric current imparting a thrust force, which is directed toward the center of the driving area and does not decrease even with decreasing table speed, to the table; and
- a switch unit that switches from a state in which the motor is controlled depending on the output of the first output unit to a state in which the motor is controlled depending on the output of the second output unit, based on a stopping signal for stopping the table.

* * * * *